US009406764B2

(12) United States Patent
Shum et al.

(10) Patent No.: US 9,406,764 B2
(45) Date of Patent: Aug. 2, 2016

(54) SIMPLE AND COST-FREE MTP STRUCTURE

(71) Applicant: GLOBALFOUNDRIES Singapore Pte. Ltd., Singapore (SG)

(72) Inventors: Danny Pak-Chum Shum, Poughkeepsie, NY (US); Yong Wee Francis Poh, Singapore (SG); Upinder Singh, Singapore (SG); Yuan Sun, Singapore (SG); Myo Aung Maung Maung, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/684,298

(22) Filed: Apr. 10, 2015

(65) Prior Publication Data

US 2015/0214238 A1    Jul. 30, 2015

Related U.S. Application Data

(63) Continuation-in-part of application No. 14/253,878, filed on Apr. 16, 2014.

(60) Provisional application No. 61/839,879, filed on Jun. 27, 2013.

(51) Int. Cl.
*H01L 27/115* (2006.01)
*H01L 29/423* (2006.01)
(Continued)

(52) U.S. Cl.
CPC .... *H01L 29/42324* (2013.01); *H01L 27/11558* (2013.01); *H01L 29/66825* (2013.01); *H01L 29/7881* (2013.01); *H01L 29/7883* (2013.01); *H01L 29/7885* (2013.01)

(58) Field of Classification Search
CPC ............... H01L 29/42324; H01L 29/7883; H01L 29/66825; H01L 29/7881; H01L 29/7885; H01L 27/11558
See application file for complete search history.

(56) References Cited

U.S. PATENT DOCUMENTS

| 5,841,165 A | 11/1998 | Chang et al. |
| 6,044,018 A | 3/2000 | Sung et al. |

(Continued)

FOREIGN PATENT DOCUMENTS

KR    100667215 B1    1/2007

OTHER PUBLICATIONS

L. Chang et al., Non-volatile memory device with true CMOS compatibility, Electronics Letters, Aug. 19, 1999, vol. 35, No. 17.
(Continued)

*Primary Examiner* — Long Pham
(74) *Attorney, Agent, or Firm* — Horizon IP Pte. Ltd.

(57) ABSTRACT

Embodiments of a simple and cost-free multi-time programmable (MTP) structure for non-volatile memory cells are presented. The memory cell includes a substrate prepared with an isolation well, a HV well region and first and second wells disposed in the substrate. The memory cell further includes a first transistor having a select gate and a second transistor having a floating gate adjacent to one another and disposed over the second well. The transistors include first and second diffusion regions disposed adjacent to the sides of the gates. A control gate is disposed over the first well and coupled to the floating gate. The control and floating gates include the same gate layer extending across the first and second wells. The control gate includes a capacitor.

20 Claims, 9 Drawing Sheets

(51) Int. Cl.
*H01L 29/788* (2006.01)
*H01L 29/66* (2006.01)

(56) References Cited

U.S. PATENT DOCUMENTS

| | | |
|---|---|---|
| 6,130,840 A | 10/2000 | Bergemont et al. |
| 6,166,954 A | 12/2000 | Chern |
| 6,211,548 B1 | 4/2001 | Ma |
| 6,452,835 B1 | 9/2002 | Diorio et al. |
| 6,711,064 B2 | 3/2004 | Yang et al. |
| 6,740,556 B1 | 5/2004 | Hsu et al. |
| 6,812,083 B2 | 11/2004 | Shen et al. |
| 6,819,594 B2 | 11/2004 | Lee et al. |
| 6,914,825 B2 | 7/2005 | Hsu et al. |
| 6,920,067 B2 | 7/2005 | Hsu et al. |
| 7,209,392 B2 | 4/2007 | Chen et al. |
| 7,391,647 B2 | 6/2008 | Fang et al. |
| 7,417,897 B2 | 8/2008 | Chen et al. |
| 7,423,903 B2 | 9/2008 | Lin et al. |
| 7,474,568 B2 | 1/2009 | Horch |
| 7,508,719 B2 | 3/2009 | Horch |
| 8,218,369 B2 | 7/2012 | Lin et al. |
| 8,305,808 B2 | 11/2012 | Lin et al. |
| 8,320,180 B2 | 11/2012 | Kalnitsky |
| 8,355,282 B2 | 1/2013 | Ching et al. |
| 8,384,155 B2 | 2/2013 | Lin et al. |
| 2007/0241392 A1 | 10/2007 | Lin et al. |
| 2008/0035973 A1 | 2/2008 | Lin et al. |
| 2009/0267127 A1 | 10/2009 | Chen et al. |
| 2010/0238738 A1 | 9/2010 | Yoo et al. |
| 2011/0233643 A1 | 9/2011 | Chang |
| 2012/0236635 A1 | 9/2012 | Ching et al. |
| 2012/0236646 A1 | 9/2012 | Hsu et al. |
| 2013/0020626 A1 | 1/2013 | Tan et al. |
| 2013/0093012 A1 | 4/2013 | Zhang et al. |
| 2014/0015047 A1 | 1/2014 | Ng et al. |
| 2015/0036437 A1 | 2/2015 | Li et al. |

OTHER PUBLICATIONS

Yanjun Ma et al., Reliability of pFET EEPROM With 70-Å Tunnel Oxide Manufactured in Generic Logic CMOS Processes, IEEE Transactions on Device and Materials Reliability, Sep. 2004, vol. 4, No. 3.

Albert Bergemont, Current limitations of floating gate NVM and new alternatives, Maxim Integrated Products, Apr. 10, 2007, EDS Meeting.

US 9,406,764 B2

SIMPLE AND COST-FREE MTP STRUCTURE

CROSS-REFERENCE TO RELATED APPLICATIONS

This application is a continuation-in-part application of co-pending U.S. patent application Ser. No. 14/253,878, filed on Apr. 16, 2014, which claims the priority benefit of U.S. Provisional Application Ser. No. 61/839,879, filed on Jun. 27, 2013. In addition, this application is concurrently filed with and cross-references to application Ser. No. 14/684,305 entitled "SIMPLE AND COST-FREE MTP STRUCTURE", and application Ser. No. 14/684,311 entitled "SIMPLE AND COST-FREE MTP STRUCTURE". All disclosures are incorporated herewith by reference in their entireties for all purposes.

BACKGROUND

Multi-time programmable (MTP) memories have been recently introduced for beneficial use in a number of applications where customization is required for both digital and analog designs. These applications include data encryption, reference trimming, manufacturing identification (ID), security ID, and many other applications. Incorporating MTP memories nonetheless also typically comes at the expense of some additional processing steps. Some of the existing approaches to constructing MTP memories tend to suffer from slow access time, smaller coupling ratio and/or large cell size. Some of the existing approaches utilize band-to-band tunneling hot hole (BBHH) for erasing operation, but requires high junction band voltage and more process steps. Other existing approaches need additional coupling erase gate and coupling capacitor, and hence require more area.

Therefore, there is a need for a simple and cost-free MTP structure to create non-volatile memory cells with the standard complementary metal-oxide-semiconductor (CMOS) platform.

SUMMARY

Embodiments generally relate to a simple and cost-free MTP structure. In one embodiment, a non-volatile MTP memory cell includes a substrate prepared with an isolation well, a high voltage (HV) well region disposed within the isolation well and first and second wells disposed within the HV well region in the substrate. A first transistor having a select gate and a second transistor having a floating gate are positioned adjacent to one another and disposed over the second well. The transistors include first and second diffusion regions disposed adjacent to the sides of the gates. A control gate is disposed over the first well and coupled to the floating gate. The control and floating gates include the same gate layer extending across the first and second wells. The control gate includes a capacitor.

In another embodiment, a non-volatile MTP memory cell is disclosed. The memory cell includes a substrate prepared with first and second isolation wells. The second isolation well is disposed within the first isolation well. First and second wells are disposed within the first isolation well. A first transistor having a select gate and a second transistor having a floating gate are positioned adjacent to one another and disposed over the second well. The transistors include first and second diffusion regions disposed adjacent to the sides of the gates. A control gate is disposed over the first well and coupled to the floating gate. The control and floating gates include the same gate layer extending across the first and second wells.

In yet another embodiment, a method for forming a non-volatile MTP memory cell is disclosed. A substrate is provided and first and second isolation wells are formed in the substrate. First and second wells are formed within the second isolation well. A first transistor having a select gate and a second transistor having a floating gate are positioned adjacent to one another and are formed over the second well. The transistors include first and second diffusion regions disposed adjacent to the sides of the gates. The first and second transistors are coupled in series and share a common second diffusion region. A control gate is formed over the first well and coupled to the floating gate. The control and floating gates include the same gate layer extending across the first and second wells. The control gate includes a capacitor.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1:
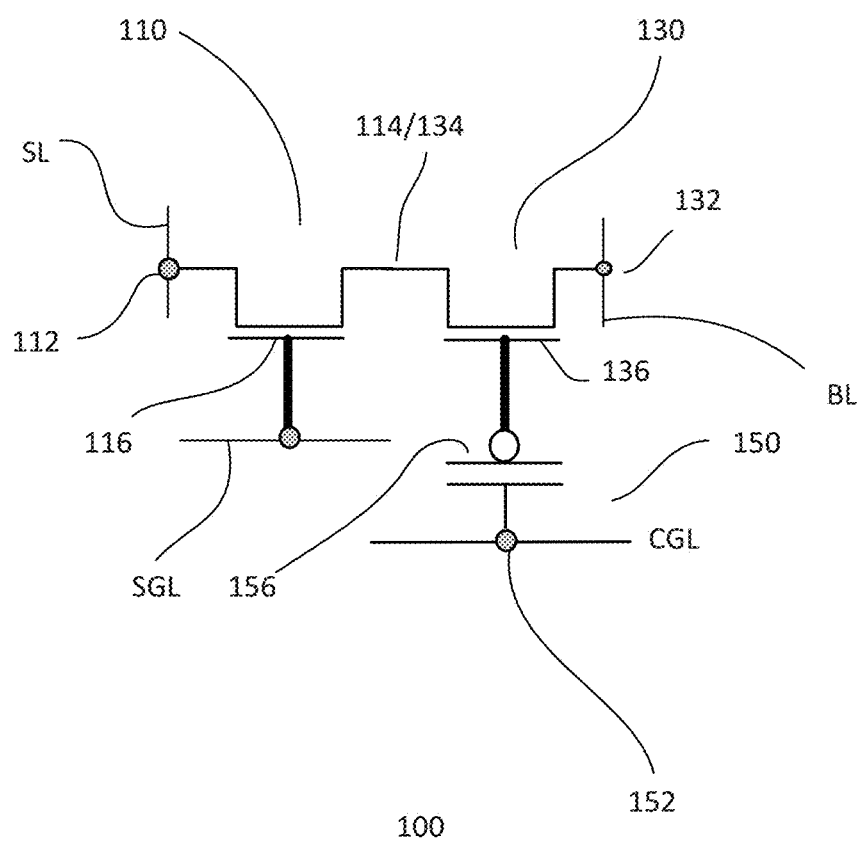
FIG. 1 shows a schematic diagram of a memory cell.

FIG. 1 shows a schematic diagram of an embodiment of a memory cell 100. The memory cell, in one embodiment, is a non-volatile (NV) multi-time programmable (MTP) memory cell 100. As shown in FIG. 1, memory cell 100 includes a first transistor 110, a second transistor 130 and a control capacitor 150. In one embodiment, the second transistor functions as a storage element and the control capacitor functions as a voltage coupling element. The first and second transistors are, for example, metal oxide semiconductor (MOS) transistors. A transistor includes a gate between first and second diffusion regions. The diffusion regions of a transistor are heavily doped regions with first polarity type dopants. The polarity type determines the type of transistor. For example, the first polarity may be n-type for a n-type transistor or p-type for a p-type transistor.

A transistor diffusion region, in one embodiment, may include diffusion extension regions (not shown). For example, a transistor diffusion region may include lightly doped diffusion extension regions extending beyond the diffusion region to underlap a portion of the transistor gate. A diffusion extension region may include a lightly doped drain (LDD) extension region and a halo region. The LDD extension region is, for example, oppositely doped to the halo region. For example, the halo region includes second polarity type dopants for a first type transistor while the LDD extension region includes first polarity type dopants for a first type transistor. Other configurations of diffusion extension regions may also be useful. For example, diffusion extension regions having only a LDD extension region without a halo region may also be useful.

A gate includes a gate electrode and a gate dielectric. The first transistor 110 serves as an access transistor while the second transistor 130 serves as a storage transistor. For example, the access transistor 110 includes a first access diffusion region 112, a second access diffusion region 114 and an access gate 116; the storage transistor 130 includes a first storage diffusion region 132, a second storage diffusion region 134 and a storage gate 136. The access gate 116 may be referred to as a select gate and the storage gate 136 may be referred to as a floating gate.

In one embodiment, the control capacitor 150 is a MOS capacitor. For example, the control capacitor 150 includes a control gate 156 with a control gate electrode and a control gate dielectric. The control gate 156 forms the control capacitor 150. The control capacitor includes first and second capacitor plates separated by a dielectric layer. The control gate electrode, for example, serves as the first (or gate capacitor) plate while a control well 209 which will be described later serves as the second (or well) capacitor plate. For example, a dielectric layer disposed over the second capacitor plate separates the first and second capacitor plates. A capacitor contact plug 152 (or well tap) which will be described later is disposed above the substrate and coupled to an active capacitor region (or well pickup region) to provide a biasing for the control well. In one embodiment, the capacitor contact plug is disposed adjacent to the control capacitor. For example, the capacitor contact plug is disposed adjacent to a side of the control gate. The capacitor contact plug provides a conductive connection to the active capacitor region. In one embodiment, the control gate is coupled to the storage gate. For example, the gates are formed from a common gate conductor. The control capacitor isolates the storage gate 136, making it a floating gate.

The access and storage transistors 110 and 130 are coupled in series. For example, the second access diffusion region and second storage diffusion region 114 and 134 form a common diffusion region of the transistors. As for the control gate 156 and storage gate 136, they are commonly coupled. For example, a common gate electrode and gate dielectric is provided to form the storage gate and control gate. Other configurations of the storage and control gates may also be useful. By commonly coupling the control and storage gates 156 and 136, a floating storage gate is produced.

The first access diffusion region 112 of the first or access transistor 110 is coupled to a source line (SL) of the memory device. The first storage diffusion region 132 of the second or storage transistor 130 is coupled to a bit line (BL) of the memory device. The select gate of the memory cell 100, or access gate 116 of the first transistor 110, is coupled to a select gate line (SGL) of the memory device. The capacitor contact plug 152 of the control capacitor is coupled to a control gate line (CGL) of the memory device. In one embodiment, the SGL is disposed along a first direction, such as a wordline direction, while the BL is disposed along a second direction, such as the bitline direction. The first and second directions, for example, are orthogonal to each other. As for the CGL, it is disposed along the wordline direction and the SL is disposed along the bitline direction. Other configurations of BL, CGL, SGL and SL may also be useful. For example, the memory cells of an array may be coupled to a common SL (CSL) disposed along a wordline direction.

Figure 2A:
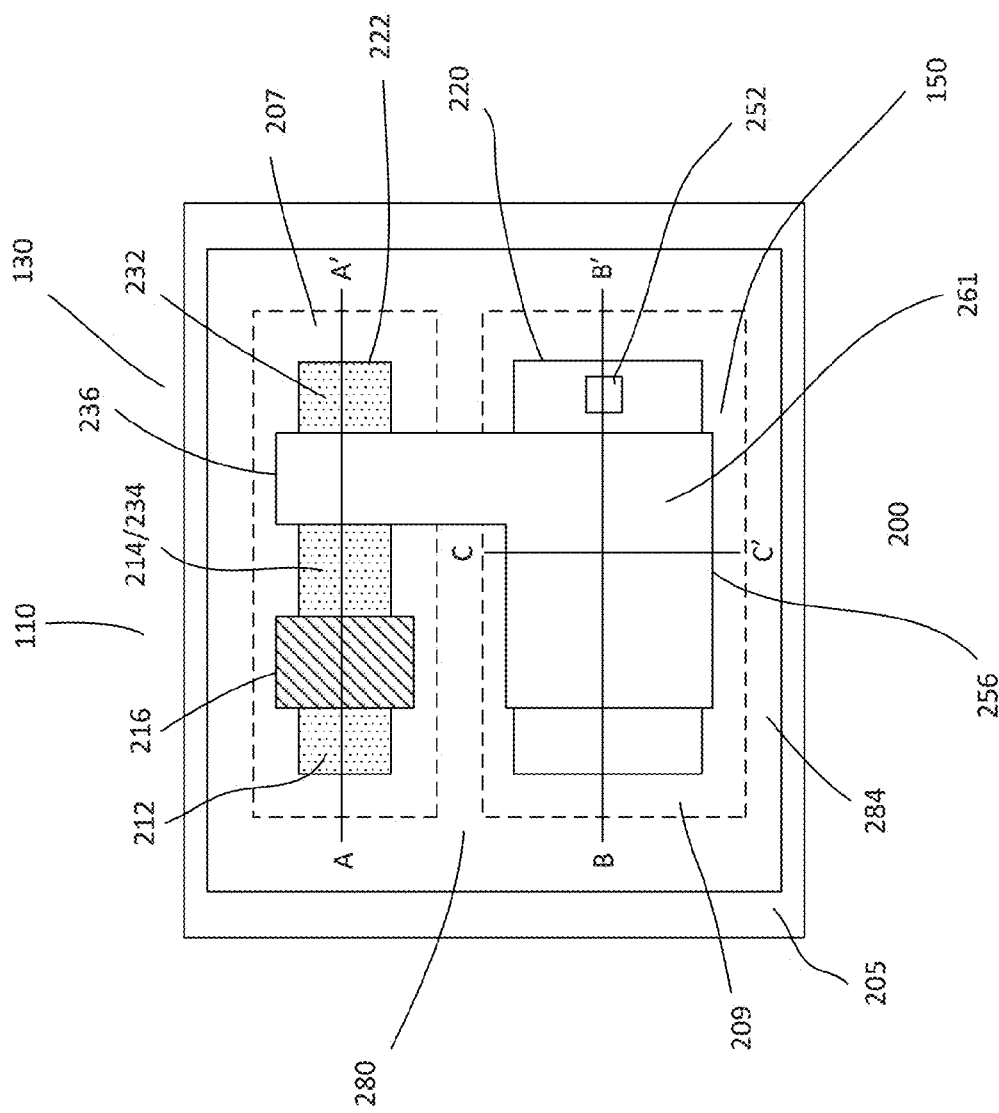
FIG. 2a shows a top view of embodiments of a memory cell and FIGS. 2b-2c show various cross-sectional views of embodiments of the memory cell.
Figure 2B:
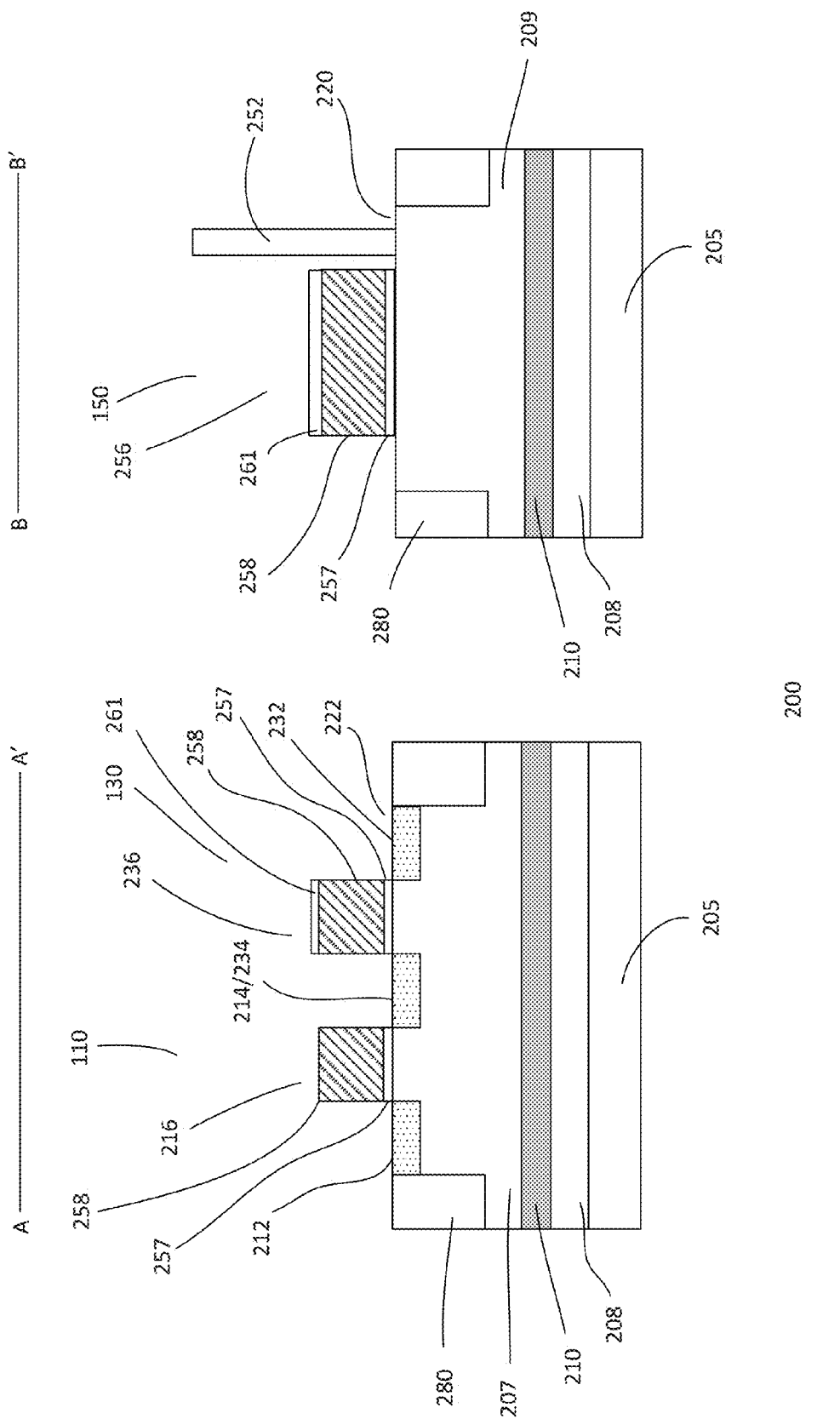
Figure 2C:
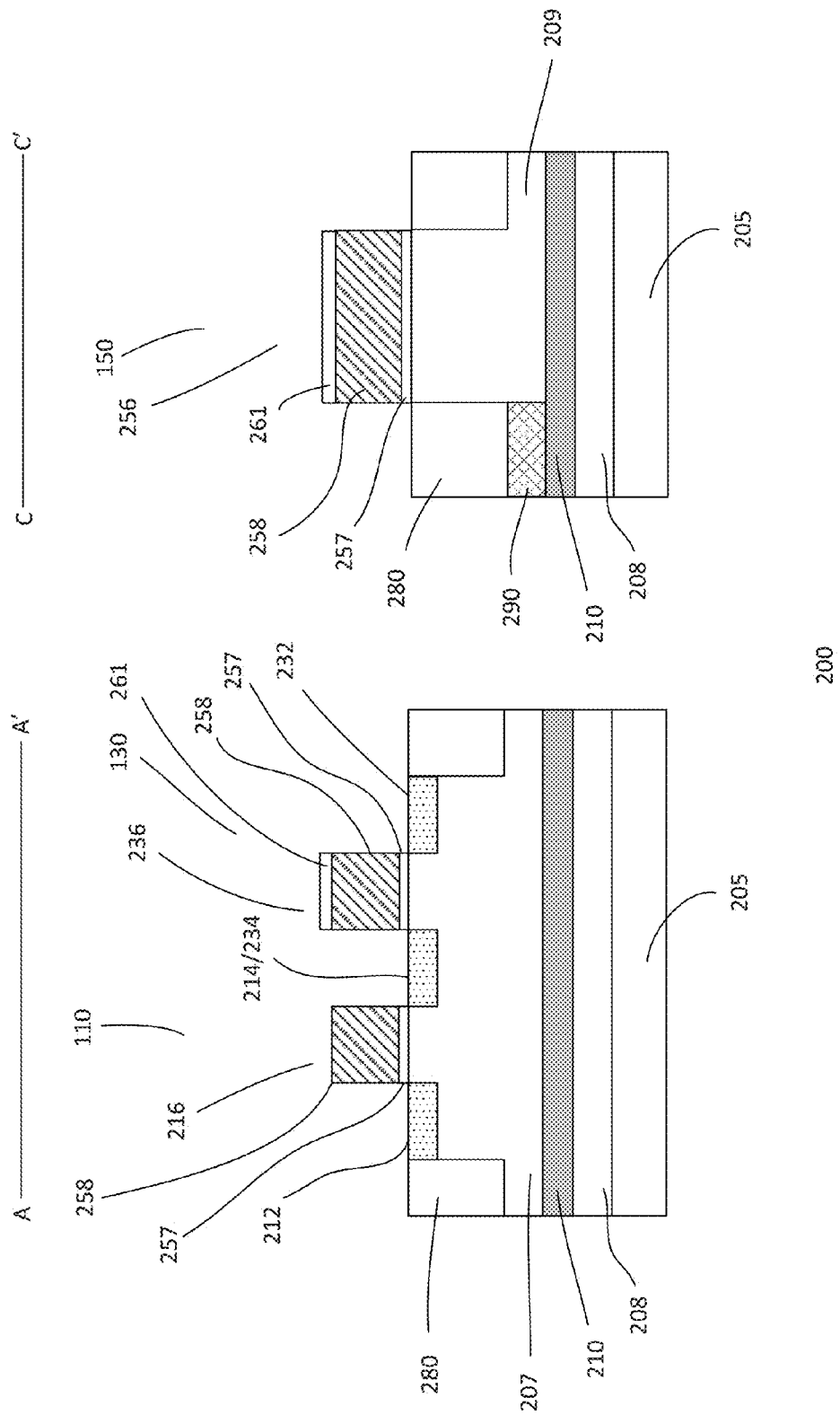

FIG. 2a shows a top view of various embodiments of a memory cell and FIG. 2b shows cross-sectional view of the memory cell of one embodiment while FIG. 2c shows cross-sectional view of another embodiment of a memory cell. The cross-sectional views are, for example, along A-A', B-B' and C-C' of the memory cell. The memory device includes a memory cell 200. The memory cell is similar to that described in FIG. 1. Common elements may not be described or described in detail. The memory cell 200 shown is a NVM cell. For example, the memory cell is a non-volatile MTP memory cell.

The device may include doped regions having different dopant concentrations. For example, the device may include heavily doped ($x^+$), intermediately doped (x) and lightly doped (x) regions, where x is the polarity type which can be p-type or n-type dopants. A lightly doped region may have a dopant concentration of about 1E11-1E12 $cm^{-2}$, an intermediately doped region may have a dopant concentration of about 1E12-1E13 $cm^{-2}$, and a heavily doped region may have a dopant concentration of about 1E13-1E14 $cm^{-2}$. Providing other dopant concentrations for the different types of doped regions may also be useful. For example, the dopant concentration range may be varied, depending on the technology node. P-type dopants may include boron (B), fluorine (F), aluminum (Al), indium (In) or a combination thereof, while n-type dopants may include phosphorous (P), arsenic (As), antimony (Sb) or a combination thereof.

The device is disposed on a substrate 205. The substrate is a semiconductor substrate, such as a silicon substrate. Other types of semiconductor substrates may also be useful. In one embodiment, the substrate 205 is a lightly doped substrate. In one embodiment, the substrate is lightly doped with dopants of a second polarity type. For example, the substrate is a lightly doped p-type ($p^-$) substrate. Providing a substrate doped with other types of dopants or undoped substrate may also be useful.

A cell region 284 is provided in the substrate. The cell region, for example, is a cell region in which the memory cell is disposed. Although one cell region is shown, the device may include a plurality of cell regions having memory cells interconnected to form a memory array. Additionally, the substrate may include other types of device regions, depending on the type of device or IC. For example, the device may include device regions for high voltage (HV), intermediate or medium voltage (MV) and/or low voltage (LV) devices.

The cell region includes first and second wells 209 and 207. The first well serves as a control well for a control gate while the second well serves as a transistor well. For example, the transistor well serves as a well for access (or select) and storage transistors 110 and 130. In one embodiment, the control gate includes a control capacitor 150. The control capacitor may be MOS capacitor. Other types of control gates may also be useful.

As shown, the wells are disposed adjacent to each other. The first well 209 accommodates the control capacitor and the second well 207 accommodates the access and storage transistors. The first (or control) well includes capacitor type dopants and the second (or transistor) well includes transistor well type dopants. In one embodiment, the control well is a lightly doped well. For example, the dopant concentration of the control well may be about 1E11-1E12 cm$^{-2}$. As for the transistor well, it may be a lightly to intermediately doped well. For example, the dopant concentration of the transistor well may be about 1E12-1E13 cm$^{-2}$. Other control and/or transistor well dopant concentrations may also be useful. The first and second wells may serve as device wells for HV and MV devices respectively. For example, the first well is sufficiently doped to form a HV device well while the second well is sufficiently doped to form a MV device well.

The first well 209 includes a depth $D_{W1}$ and the second well 207 includes a depth $D_{W2}$ from the surface of the substrate. Although the first and second wells are illustrated to have about the same depth dimension from the surface of the substrate, it is to be understood that the first and second wells may also include different depth dimensions. For example, $D_{W1}$ of the first well may be different than $D_{W2}$ of the second well.

The polarity type of the control well dopant may depend on the polarity type of control gate. In one embodiment, the polarity type of the control well depends on the polarity type of the control capacitor. In the case of a control capacitor, the control well is the same polarity as the capacitor type. For example, the control well dopant is p-type for a p-type MOS capacitor or n-type for a n-type MOS capacitor. As for the transistor well dopants, it is the opposite polarity type to the transistor. In one embodiment, the transistor well dopants are second polarity type dopants for a first type transistor with first polarity type dopants. For example, the transistor well dopants are p-type for a n-type transistor. In one embodiment, the transistor well is of opposite polarity type to that of the control well. For example, a second polarity type transistor well is provided for a first polarity type control well. The first polarity type may be n-type and the second polarity type may be p-type. Other configurations of transistor and control wells may also be useful. For example, the first polarity type may be p-type and the second polarity type may be n-type.

An isolation well 208 may be provided in the substrate, as shown in FIGS. 2b-2c. The isolation well may be a deep isolation well disposed below the first and second wells. In one embodiment, the isolation well is a common isolation well of a memory chip. The isolation well, for example, encompasses a plurality of memory arrays of a memory chip. The isolation well includes isolation well dopants. In one embodiment, the isolation well is lightly doped with isolation well dopants. The isolation well dopants are, for example, opposite polarity type to the substrate type. In one embodiment, the isolation well dopants are first polarity type dopants for a second polarity type substrate. For example, a n-type isolation well is provided for a p-type substrate. Other configurations of isolation well and substrate may also be useful. The isolation well 208 serves to isolate the first and second wells from the substrate to improve noise immunity of the memory device. The isolation well 208 has a depth $D_N$ from the surface of the substrate. The isolation well 208 may be referred to as the first isolation well.

In some embodiments, a HV well region 210 may be provided within the isolation well 208 in the substrate. In one embodiment, the HV well region encompasses the first and second wells. For example, the HV well region separates the first and second wells 209 and 207 from the isolation well 208. In one embodiment, the HV well region is a common HV well region of a memory array. The HV well region, for example, encompasses a plurality of memory cells of a memory array. The HV well region includes HV well dopants. In one embodiment, the HV well region 210 is lightly doped with HV well dopants. The HV well dopants are, for example, opposite polarity type to the isolation well dopants. In one embodiment, the HV well dopants are second polarity type for first polarity type isolation well dopants. For example, a p-type HV well region is provided for a n-type isolation well. Other configurations of HV well region and isolation well may also be useful. In one embodiment, the HV well region and control well are doped with opposite polarity type dopants. For example, a p-type HV well region is provided for n-type isolation and control wells 208 and 209. The HV well region serves to improve isolation of the control well during device or programming operations. Providing a HV well region enables selective programming and reduces cell size layout. The HV well region has a depth $D_P$ from the surface of the substrate. The HV well region may be referred to as the second isolation well.

In one embodiment, $D_P$ is shallower than $D_N$ and deeper than $D_W$. In general, $D_W$ is less than $D_P$ which is less than $D_N$ ($D_W < D_P < D_N$). For example, $D_N$ may be about 1.8 μm while $D_P$ may be about 0.8-1.2 μm. Other suitable depth dimensions for $D_W$, $D_N$ and $D_P$ may also be useful.

A cell isolation region 280, as shown, separates the first and second wells as well as the other device regions. In one embodiment, the cell isolation region 280 sufficiently overlaps the first and second wells 209 and 207 to isolate the different wells. For example, the cell isolation region overlaps a portion of the first and second wells. In one embodiment, a bottom portion of the first and second wells extends below the cell isolation region. For example, the first and second wells extend below and underlap the cell isolation region. Other configurations of first and second wells may also be useful. Providing other types of isolation region between the first and second wells may also be useful. The cell isolation region defines the active regions in the first and second wells. For example, the cell isolation region defines the active transistor region 222 in the second well 207 and the active capacitor region 220 in the first well 209. The cell isolation region is, for example, a shallow trench isolation (STI) region. Other types of isolation regions may also be useful.

The cell isolation region has a depth $D_I$. For example, the cell isolation region has a depth from the surface of the substrate to $D_I$. In one embodiment, the cell isolation region has a depth which is shallower than the first and second wells. For example, $D_I$ is less than the depth of the first and second wells and the HV well region ($D_I < D_W < D_P$). $D_I$, for example, may be about 0.5 μm. Other suitable depth dimensions for $D_I$ may also be useful.

In another embodiment, a native layer 290 underlaps the cell isolation region separating the first and second wells 209 and 207, as shown in FIG. 2c. The native layer 290 is disposed between the bottom portion of the first and second wells. For example, the native layer separates the first and second wells. In one embodiment, the manufacturing process is designed to include a substrate region preserved with the low doping concentration of the substrate 205 to form the native layer 290. The native layer is, for example, an intrinsically doped layer and serves as a blocking layer to preserve the original lightly doped portion of the substrate that may become heavily doped regions formed during logic (or host) process steps. Other types of native layer may also be useful. The native layer extends from the bottom of the cell isolation region to a depth about $D_W$. For example, the first and second wells do not underlap the cell isolation region. The threshold voltage (Vt) is typically low, for example, about 0.2 V and the native layer is a lightly doped layer having characteristics which are very similar or close to the starting substrate. Thus, the presence of the native layer improves isolation between the first and second wells and increases the breakdown voltage.

Access and storage transistors are disposed on the active transistor region in the second or transistor well. A transistor includes a gate disposed between first and second diffusion regions. The diffusion regions, for example, include dopants of the same polarity type as the transistor type dopants. For example, p-type transistors have diffusion regions with p-type dopants. The diffusion regions, for example, are heavily doped regions. The gate is disposed on the substrate while the diffusion regions are disposed in the active region of the substrate. A gate includes a gate electrode 258 and a gate dielectric 257. The gate electrode 258, for example, may be a polysilicon gate electrode and the gate dielectric 257 may be a silicon oxide gate dielectric. Other types of gate electrode or dielectric materials may also be useful.

Dielectric spacers (not shown) may be provided on the gate sidewalls of the transistors. The spacers may be used to facilitate forming transistor diffusion regions. For example, spacers are formed after diffusion extension regions are formed. Spacers may be formed by, for example, forming a spacer layer on the substrate and anisotropically etching it to remove horizontal portions, leaving the spacers on sidewalls of the gates. After forming the spacers, an implant is performed to form the transistor diffusion regions.

As discussed, the access transistor 110 includes first and second access diffusion regions 212 and 214 heavily doped with transistor type dopants in the active transistor region 222 and an access gate 216 on the substrate. A transistor diffusion region, in one embodiment, may include diffusion extension regions (not shown) which extend beyond the diffusion region to underlap a portion of the transistor gate. The access gate includes an access gate electrode 258 over an access gate dielectric 257. The access gate may be referred to as a select gate. The storage transistor 130 includes first and second storage diffusion regions 232 and 234 heavily doped with transistor type dopants in the substrate and a storage gate 236 on the substrate. The storage gate includes a storage gate electrode 258 over a storage gate dielectric 257. The storage gate may be referred to as a floating gate. The access and storage transistors 110 and 130 are coupled in series. In one embodiment, the second access diffusion region 214 and second storage diffusion region 234 form a common diffusion region of the transistors. Other configurations of series connection for the access and storage gates may also be useful.

The control capacitor 150 is disposed on the first well. The control capacitor includes a control gate 256 disposed on the substrate over the active capacitor region. The control gate includes a control gate electrode 258 over a control gate dielectric 257. The control gate electrode 258, for example, may be a polysilicon control gate electrode and the control gate dielectric 257 may be silicon oxide control gate dielectric. Other types of gate electrode or dielectric materials may also be useful. The control gate electrode, in one embodiment, is doped with control or capacitor type dopants. For example, the control gate electrode is heavily doped with same polarity type dopants as the control well. A capacitor contact plug 252 is disposed above the control well and adjacent to a side of the control gate. For example, the capacitor contact plug is displaced away from a side of the control gate. In one embodiment, the capacitor contact plug is coupled to the active capacitor region (or well pickup region) between the cell isolation region and a side of the control gate. The capacitor contact plug, for example, may be a conductive contact plug, such as a tungsten contact plug. Other types of conductive contact plugs may also be useful. The capacitor contact plug 252 serves as a well tap to the well pickup region of the capacitor. Although one capacitor contact plug is shown, it is understood that there could be more than one capacitor contact plug coupled to the active capacitor region or exposed top surface of the control well. The control well 209 serves as the second or well capacitor plate while the gate electrode 258 serves as the first or gate capacitor plate. In one embodiment, the capacitor gate electrode is doped before forming the capacitor contact plug. For example, a gate electrode layer deposited on the substrate is pre-doped with control dopants and patterned to form the capacitor gate electrode.

In one embodiment, the control gate and storage gate electrodes 258 are commonly coupled. In one embodiment, the control gate 256 and storage gate 236 are formed of the same gate layers. For example, patterning the gate layers create the control and storage gates. In such cases, the control gate 256 and storage gate 236 are formed of the same material. For example, the control gate electrode and dielectric layers are formed of the same material as the storage gate electrode and dielectric layers. The gate electrodes are, for example, doped with capacitor type dopants. Providing gate electrodes with other dopant types may also be useful. In one embodiment, the access, storage and control gates are formed from the same gate layers. Other configurations of the gates may also be useful. For example, the gates may be formed from different gate layers.

Metal silicide contacts (not shown) may be provided on contact regions of the memory cell. The metal silicide contacts, for example, may be nickel or nickel-based metal silicide contacts. Other suitable types of metal silicide contacts, including cobalt or cobalt-based metal silicide contacts, may also be useful. In one embodiment, metal silicide contacts are provided on the transistor diffusion regions, active capacitor region and the access gate. A silicide block 261 is disposed over the storage and control gates. The silicide block, for example, is a dielectric material, such as silicon oxide or silicon nitride. Other types of silicide blocks may also be useful. Providing a silicide block over the storage and control gates prevents formation of silicide contacts over the gates. This improves data retention.

The first access diffusion region 212 is coupled to a SL of the memory device. The first storage diffusion region 232 is coupled to a BL of the memory device. The access gate 216 is coupled to a SGL of the memory device. The capacitor contact plug 252 is coupled to a CGL of the memory device. In some embodiments, the control gate 256 is implemented as a control capacitor 150. In one embodiment, the SGL is disposed along a first direction, such as a wordline (WL) direction, while the bitline is disposed along a second direction, such as the bitline (BL) direction which is perpendicular to the WL direction. The CGL may be disposed along the wordline direction and the SL is disposed along the bitline direction. Other configurations of BL, CGL, SGL and SL may also be useful. For example, the memory cells of an array may be coupled to a common SL (CSL) disposed along a wordline direction.

The various conductive lines of the memory cell may be disposed in metal levels of the device. Conductive lines disposed in the same direction may be provided in the same metal level. For example, conductive lines disposed along the BL direction may be disposed in Mx while conductive lines disposed along the WL direction may be disposed in Mx+i of the device. Other configurations of conductive lines and metal levels may also be useful.

The memory cell described has improved or more efficient programming due to increased capacitive coupling ratio. For example, the layout of the control gate (CG) and floating gate (FG) can be designed to have an area ratio to produce the desired capacitive coupling ration. In some embodiments, an area ratio of CG:FG may be about 0.8:0.2. For example, width (W)×length (L) of the floating gate may be about 0.4×0.28, while W×L of the control gate may be about 1.6×0.84. Providing other CG:FG area ratios may also useful. By providing a large area for the control gate, a medium bias on the capacitor well can be generated. This bias is transferred to the floating gate for efficient programming of the memory cell. Reducing the higher voltage required for the capacitor well also allows a smaller charge pump to be formed. This further reduces the size of the device.

In some embodiments, reduced resistive voltage drops and thereby improves process robustness may be achieved by providing multiple contacts, such as capacitor contact plugs, coupled to the well capacitor plate of the capacitor. For example, one or more contacts plugs may be disposed adjacent to the control gate to electrically couple the well capacitor plate to a CGL. The number of contact plugs may depend on the circumference of the control gate, the size of the active capacitor region and the size and pitch of the contacts. The greater number of contacts will lower the resistance.

Figure 3B:
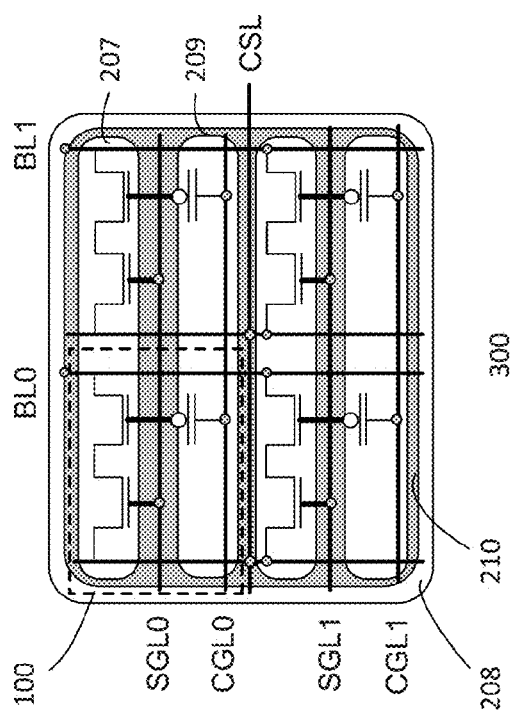
FIGS. 3a-3b show schematic diagrams of embodiments of an array of memory cells.
Figure 3A:
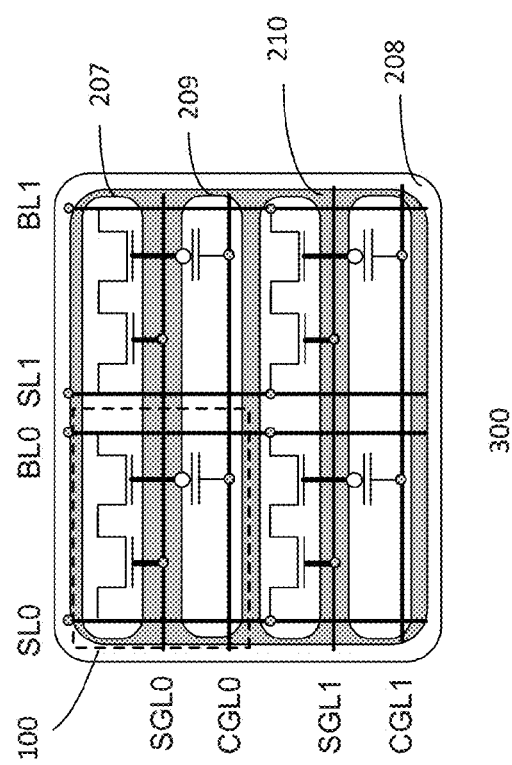

FIGS. 3a-3b show schematic diagrams of embodiments of an array 300 of memory cells. A portion of the array is shown with, for example, four memory cells 100, such as those described in FIGS. 1 and 2a-2c. Common elements may not be described or described in detail. The array of memory cells may be formed on a substrate having first and second wells 209 and 207 disposed within a HV well region 210. The HV well region is, in some embodiments, surrounded by an isolation well 208 which is common to memory arrays of a memory chip. In one embodiment, the first and second wells extend across multiple columns of interconnected memory cells of an array. The first and second wells, for example, form common first and second wells of a memory array. Other configurations of first and second wells may also be useful.

As shown in FIG. 3a, the memory cells are interconnected to form two columns connected by BLs (BL0 and BL1) and SLs (SL0 and SL1) and two rows of memory cells connected by SGLs (SGL0 and SGL1) and CGLs (CGL0 and CGL1). In one embodiment, the SLs (SL0 and SL1) of each column of memory cells are coupled to separate source terminals. For example, SL0 and SL1 are coupled to first and second source terminals and BL0 and BL1 are coupled to first and second terminals. Coupling separate columns of memory cells to separate (or dedicated) source terminals form an AND-type array configuration. For example, the AND-type array configuration illustrated has access and storage transistors of each column coupled to separate SL and BL terminals respectively. Having an AND-type array configuration provides more reliable memory cell operation within an array.

In another embodiment, the SLs of each column of memory cells are coupled to a common source terminal. As shown in FIG. 3b, the SLs of each column of memory cells may be coupled to a common source line (CSL) disposed in a WL direction. Coupling separate columns of memory cells to a common source terminal forms a NOR-type array configuration. The NOR-type configuration illustrated has access transistors in separate columns coupled to a CSL while the storage transistors in separate columns are coupled to separate BL (or drain) terminals. Having a NOR-type array configuration provides random access to the memory cell and reduces footprint of an array. Other configurations of an array may also be useful.

Although a 2×2 portion of an array is shown, it is understood that the array may include numerous rows and columns. For example, the memory array may form a memory block.

The memory cell of FIGS. 1 and 2a-2c, in one embodiment, is configured to include first type transistors and a first type capacitor. For example, the access and storage transistors are same polarity type to that of the control capacitor. In one embodiment, the first type is n-type. For example, the memory cell is configured with n-type transistors and a n-type capacitor. In such cases, the transistor (or second) well 207 and capacitor (or first) well 209 include opposite polarity type dopants. The transistor well includes second polarity type or p-type dopants while the control well includes first polarity type or n-type dopants. The transistor diffusion regions are n-type. Furthermore, the gate electrodes are doped with capacitor type dopants. For example, the gate electrodes are doped with first polarity type or n-type dopants. Other gate configurations may also be useful.

Figure 4B:
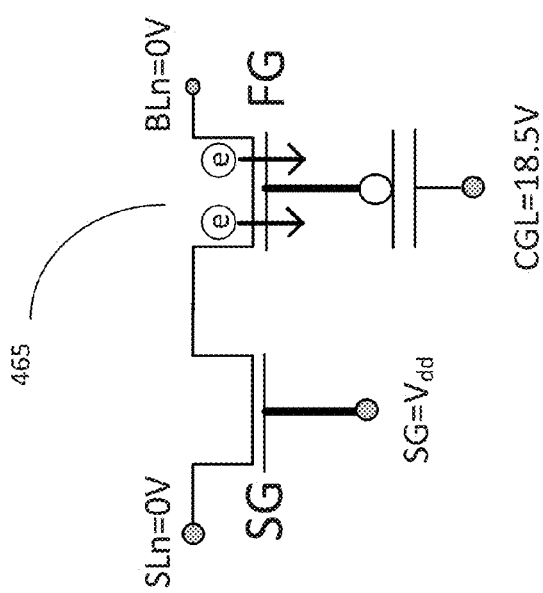
FIGS. 4a-4c show various operations of a memory cell.
Figure 4A:
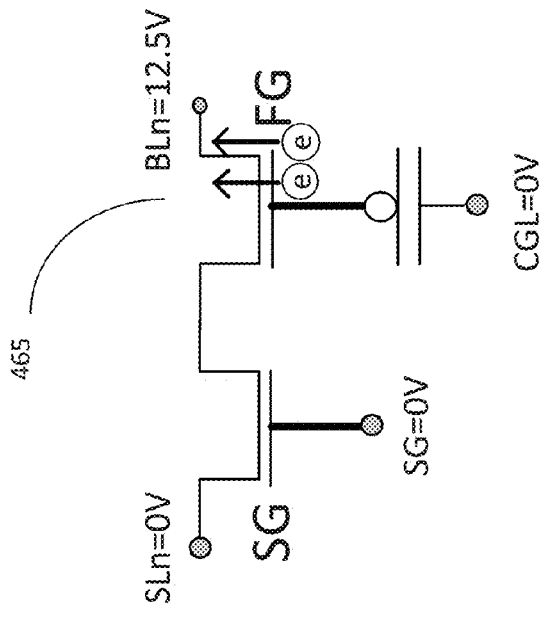
Figure 4C:
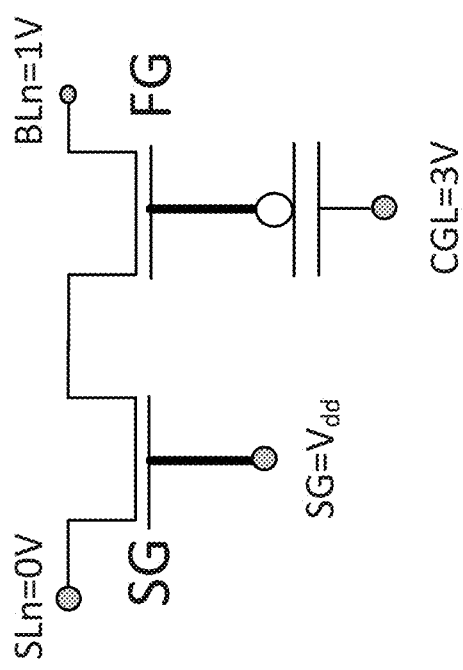

For a memory cell with first type transistors and capacitor, various operating modes are described in FIGS. 4a-4c. The first type is, for example, n-type. Table 1 below shows various biasing voltages at various terminals of a memory cell for program, erase and read operating modes:

TABLE 1

| | Signals | | | | | | | | |
| --- | --- | --- | --- | --- | --- | --- | --- | --- | --- |
| | CGL | | BLn | | SLn | | SG (nFET) | | PW (transistor |
| Modes | sel | unsel | sel | unsel | sel | unsel | sel | unsel | well or HV well) |
| PGM: FN (bit) | 18.5 V | 0 V | 0 V | Vdd | 0 V | Vdd | Vdd | Vdd | 0 V |
| ERS: FN (block or column) | 0 V | 0 V | 12.5 V | 12.5 V | 0 V | 0 V | 0 V | 0 V | 0 V |
| Read | 3 V | 0 V | 1 V | 0 V | 0 V | 0 V | Vdd | 0 V | 0 V |

The values in Table 1 are exemplary using Fowler-Nordheim (FN) tunneling for program and erase operations. For example, the values are for an operating voltage $V_{dd}$ equal to about 5V. Other suitable voltage values may also be useful.

The memory cell may operate in Fowler-Nordheim (FN) tunneling program mode 400a, as illustrated in FIG. 4a. To effect a FN tunneling program operation, the various select (sel) signals for such a program operation are provided at the various terminals of the selected memory cell. In the program mode, electron carriers 465 tunnel through from the transistor well to the floating gate (FG). Other suitable types of programming modes, such as channel hot electron (CHE) injection programming mode, may also be useful. In the CHE programming mode, for example, electron carriers are injected from the transistor channel to the FG on the drain side.

The memory cell may operate in FN tunneling erase mode 400b, as illustrated in FIG. 4b. To effect a FN tunneling erase mode, the various sel signals for such an erase operation are provided at the various terminals of the selected memory cell. In the erase mode, electron carriers 465 move from the FG to the transistor well from the drain side of the gate. The erase mode may effect a memory block or column erase operation.

As for a read operation 400c, it is illustrated in FIG. 4c. The various select (sel) signals for a read operation are provided at the various terminals of the selected memory cell to effect the read operation.

Figure 5:
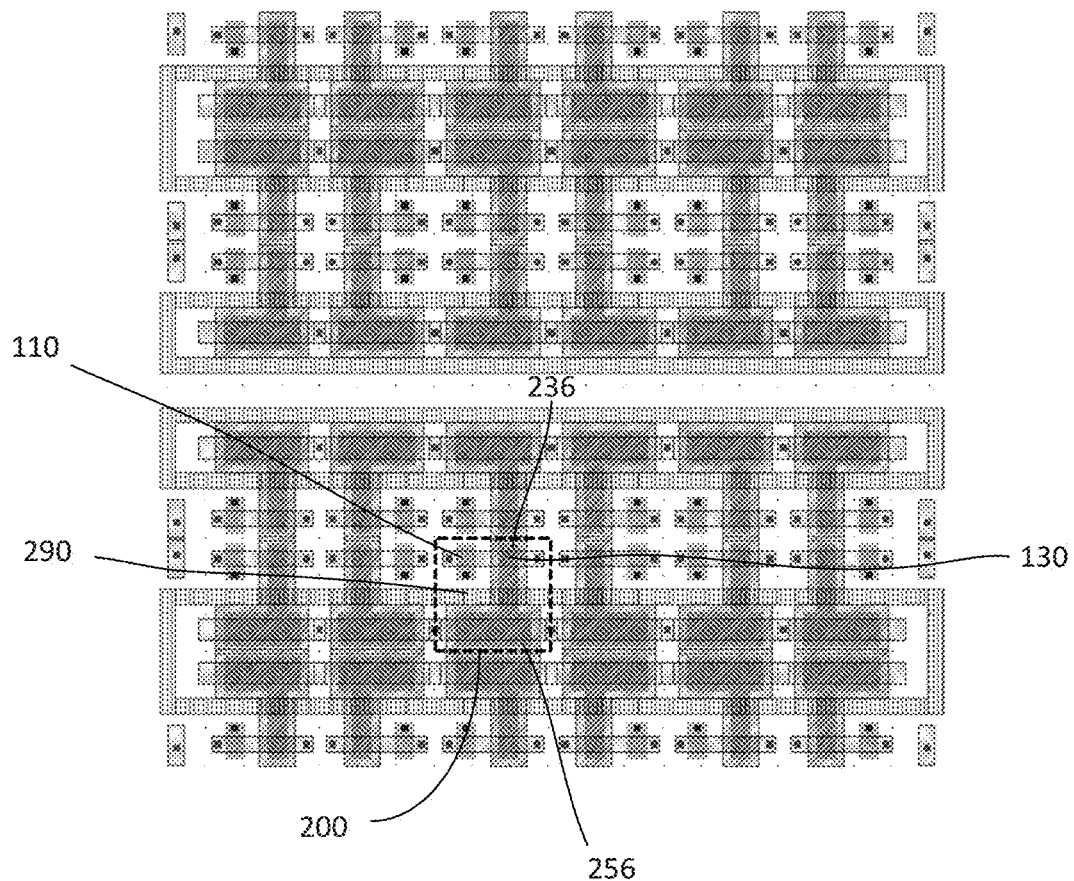
FIG. 5 shows a plan view of an array of an embodiment of memory cells.

FIG. 5 shows a plan view of an embodiment of an array 500 of memory cells of a memory device. The memory cell is similar to that described in FIG. 1 and FIGS. 2a-2c. Common elements may not be described or described in detail. The memory cell 200 shown is a non-volatile memory cell. For example, the memory cell is a non-volatile MTP memory cell. As shown, the memory cell includes access and storage transistors 110 and 130 coupled in series while a control gate 256 is commonly coupled to the storage gate 236 to produce a floating gate. The transistors are disposed on an active transistor region and the control gate is disposed on an active capacitor region. The array of memory cells may be formed on a substrate having an isolation well, a HV well region and first and second wells.

The array 500, in one embodiment, includes a plurality of memory cells arranged in inverse orientations to each other. For example, the memory cells on first and second sides are mirror images of one another and the memory cells on top and bottom sides are mirror images of one another. In another embodiment, along the Y or wordline direction, the memory cells may be placed as it is (i.e. with no mirror image). In one embodiment, native layers 290 are disposed in the substrate between the active transistor and capacitor regions. The native layer, for example, increases breakdown voltage and improves isolation between the transistor and control wells.

The plurality of memory cells may be interconnected by the various lines to form an array. For example, memory cells may be interconnected by SGLs and CGLs to form rows of memory cells and BLs and SLs to form columns of memory cells. Accessing a memory cell may be achieved by applying appropriate signals to the various lines or terminals of the memory cell. Bit programming of the memory cell is achieved by FN tunneling to tunnel electrons from the transistor well into the floating gate. A block or column erase may be achieved by FN electron tunneling from the FG to the transistor well from the drain side of the gate.

Figure 6:
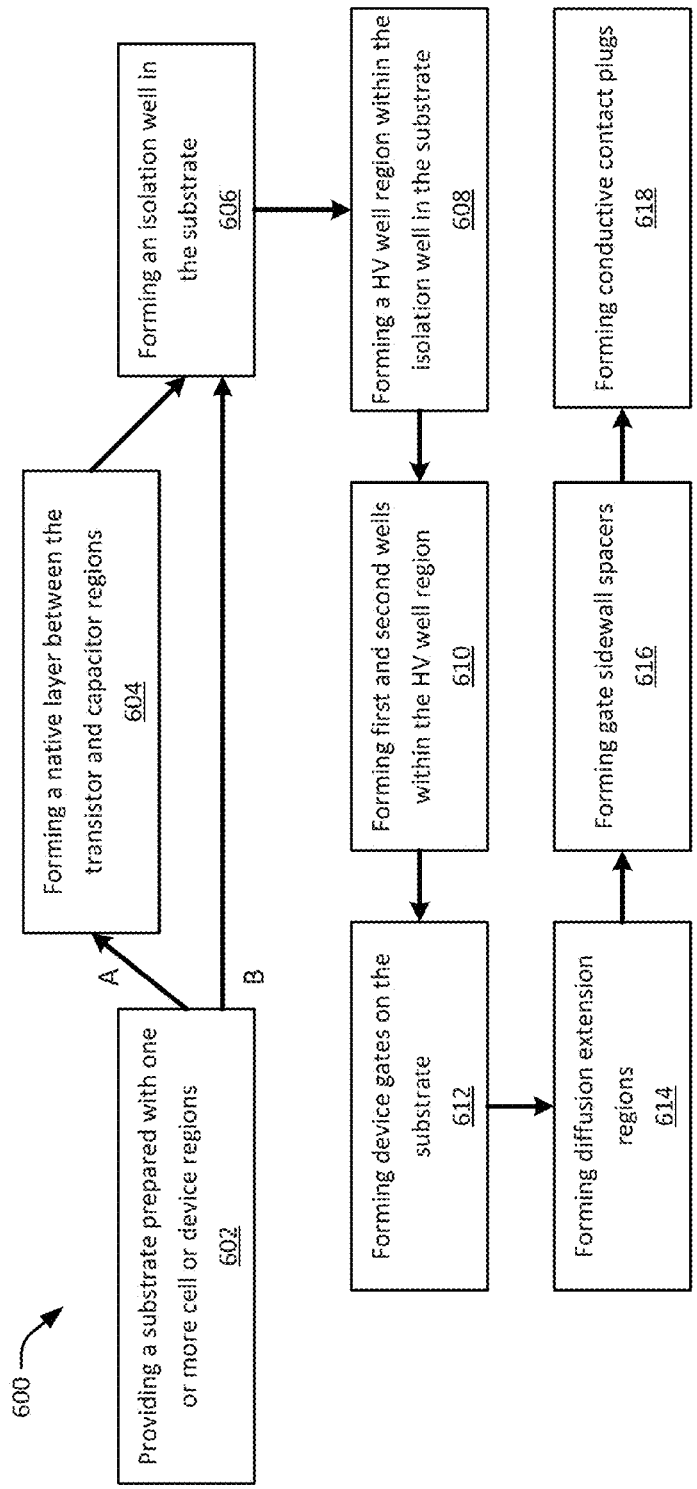
FIG. 6 shows a process for forming embodiments of a memory cell.

FIG. 6 shows a process 600 for forming embodiments of the memory cell described herein. In particular, process 600 illustrates an exemplary semiconductor manufacturing process flow to form a memory cell described in FIG. 1 and FIGS. 2a-2c. Common elements may not be described or described in detail.

At 602, the process of forming the device includes providing a substrate prepared with one or more cell or device regions. The substrate is, for example, lightly doped with second polarity type dopants, such as p-type dopants. Providing a substrate doped with other types of dopants or undoped substrate may also be useful. A device region is isolated from another device region by device isolation regions, such as shallow trench isolation (STI) regions. In one embodiment, the device isolation regions define active regions, such as the active transistor and capacitor regions. For example, device isolation regions isolate the transistor and capacitor regions and other device regions, such as HV, MV and/or LV devices. In one embodiment, forming the device isolation region includes forming a trench in the substrate and forming an insulation layer which fills the trench.

In one embodiment, the process flow may continue along arrow A to form a native layer before forming an isolation well in the substrate. In an alternative embodiment, the process flow may continue along arrow B to form the isolation well in the substrate without forming a native layer.

At 604, a native layer is formed between the transistor and capacitor regions. The native layer may be disposed in the substrate below the device isolation region, as shown in FIG. 2c. The native layer is an intrinsically doped layer introduced during the manufacturing process. In one embodiment, the manufacturing process is design to form a native layer which serves as a blocking layer to preserve the original lightly doped portion of the substrate that may become heavily doped regions formed during logic (or host) process steps. For example, the manufacturing process is designed to include a substrate region preserved with the low doping concentration of the substrate 205 to form the native layer 290. Other suitable techniques to form the native layer may also be useful. The native layer includes a depth deeper than the device isolation region. For example, a device isolation region is disposed above the native layer. The native layer, in one embodiment, is a lightly doped layer underlapping the device isolation region which separates the first and second wells. The native layer, for example, may be about 0.39 µm wide. Other suitable dimensions of native layer may also be useful. The native layer separates the bottom portion of the wells extending below the device isolation region. The depth of the native layer may be about the depth of the first and/or second wells. In the case where a native layer is present, the native layer increases the breakdown voltage and improves isolation between the first and second wells.

At 606, an isolation well is formed in the substrate. In one embodiment, the isolation well is a common isolation well encompassing memory arrays of a memory chip. The isolation well is, for example, a deep isolation well implanted to a depth below the device isolation regions. Other methods of forming the isolation well may also be useful. In one embodiment, a first polarity type isolation well is formed for a second polarity type substrate. For example, the isolation well is lightly doped with n-type dopants for a p-type substrate. Other dopant concentrations and dopant types may also be useful.

At 608, a HV well region is formed within the isolation well in the substrate. For example, the isolation well encompasses the HV well region. In one embodiment, the HV well region is a common HV well region encompassing an array of interconnected memory cells. The HV well region is, for example, implanted to a depth shallower than the isolation well but deeper than the device isolation regions. Other techniques for forming the HV well region may also be useful. In one embodiment, a second polarity type HV well region is formed for a first polarity type isolation well. For example, the HV well region is lightly doped with p-type dopants for a n-type isolation well. Other dopant concentrations may also be useful. Other configurations of HV well region and isolation well may also be useful.

At 610, first and second wells are formed within the HV well region. For example, the HV well region encompasses the first and second wells. The first well is formed in the active capacitor region and the second well is formed in the active transistor region. The first and second wells are, in one embodiment, implanted to a depth shallower than the HV well region but deeper than the device isolation regions. The first and second wells have, for example, about equal depths. Providing first and second wells having different depths may also be useful. Other techniques for forming the wells may also be useful. The first well is lightly doped with control or capacitor type dopants and the second well is lightly to intermediately doped with transistor type dopants. Other dopant concentrations may also be useful.

At 612, device gates are formed on the substrate. A gate dielectric layer is deposited on the substrate and across the device regions to form gate dielectrics of the various devices. For example, a silicon oxide layer is formed on the substrate to form gate dielectric layer. The gate dielectrics may be defined with different thicknesses for different device regions. In one embodiment, a gate electrode layer, such as a polysilicon layer, is deposited on the gate dielectric layer and patterned to form gate electrodes of the various devices. In one embodiment, the gate electrode layer is a doped polysilicon layer. For example, a gate electrode of a control gate is pre-doped with control or capacitor type dopants to form the control gate. The gate electrode and gate dielectrics are patterned to form gates of devices, such as HV, MV and/or LV devices. The process may continue to form a memory cell, such as a MTP memory cell. The memory cell, in one embodiment, is made of HV and/or MV devices. For example, the access and storage transistors are MV devices and the control capacitor is a HV device.

At 614, diffusion extension regions are formed. In one embodiment, LDD and halo regions are formed adjacent to the sides of the transistor gates extending under the gates. A common implant mask is employed, for example, to form the LDD and halo regions. For example, the implant mask is used to form halo regions in a first implant step and a second implant step is performed to form the LDD regions into the halo regions to form halo and LDD regions of the transistors. Other suitable techniques may also be used to form the halo and LDD regions. Providing LDD regions without halo regions may also be useful.

At 616, gate sidewall spacers are formed. A dielectric spacer layer may be deposited on the substrate and over the device regions. The dielectric spacer layer is patterned to form gate sidewall spacers. The sidewall spacers, for example, overlap the LDD and halo regions. In one embodiment, the exposed substrate regions adjacent to the sidewall spacers are heavily doped with first or second polarity type dopants to form transistor diffusion regions. The transistor diffusion regions are, for example, implanted deeper than the LDD and halo regions and aligned to about the gate sidewall spacers.

At 618, conductive contact plugs are formed. In one embodiment, a capacitor contact plug is formed above the control well. For example, the capacitor contact plug may be formed using a single damascene process in a pre-metal dielectric (PMD) layer (not shown) disposed on the substrate. The capacitor contact plug is coupled to the active capacitor region between the device isolation region and the capacitor. The capacitor contact plug is, for example, disposed adjacent to a side of the control gate. Other configurations of capacitor contact plug may also be useful. In one embodiment, the capacitor contact plug is a conductive contact plug. The capacitor contact plug, for example, may be a tungsten contact plug. Other types of conductive contact plugs may also be useful. The capacitor contact plug serves as a well tap to the well pickup region of the capacitor.

The process continues to complete forming the device. The processing may include forming an interlayer dielectric (ILD) layer, metal silicide contacts to the terminals of the memory cell, conductive contacts as well as one or more interconnect levels, final passivation, dicing, assembly and packaging. Other processes to complete forming the device may also be included. Other suitable process to form the device, as shown in FIGS. 2a-2c, may also be useful.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A non-volatile (NV) multi-time programmable (MTP) memory cell comprising:
    a substrate prepared with first and second isolation wells, wherein the second isolation well is disposed within the first isolation well;
    first and second wells disposed within the second isolation well;
    a first transistor having a select gate and a second transistor having a floating gate adjacent to one another and disposed over the second well, the transistors comprise first and second diffusion regions disposed adjacent to the sides of the gates; and
    a control gate disposed over the first well, wherein
        the control gate is coupled to the floating gate and the control and floating gates comprise the same gate layer extending across the first and second wells,
        the control gate comprises a capacitor, and
        the second isolation well is configured to improve isolation of the first well during device operation.

2. The memory cell of claim 1 wherein the first well is of a first polarity type and the second well is of a second polarity type different from the first polarity type.

3. The memory cell of claim 2 wherein the first well is an n-type well and the second well is a p-type well, wherein each of the floating gate and the select gate comprises an n-type metal oxide-semiconductor (NMOS), and wherein the control gate comprises an n-type capacitor.

4. The memory cell of claim 3 wherein the memory cell is programmable by Fowler-Nordheim (FN) tunneling effect.

5. The memory cell of claim 3 wherein the memory cell is erasable by FN tunneling effect.

6. The memory cell of claim 3 comprising a capacitor contact plug coupled to the first well.

7. The memory cell of claim 1 wherein the second isolation well comprises a high voltage (HV) well region, wherein the HV well region comprises a depth deeper than the first and second wells.

8. The memory cell of claim 7 wherein the first isolation well comprises a depth deeper than the HV well region.

9. The memory cell of claim 8 wherein the HV well region is of a second polarity type and the first isolation well is of a first polarity type different from the second polarity type.

10. The memory cell of claim 9 wherein the HV well region is a common well region of a memory array.

11. The memory cell of claim 8 wherein the first well is of a first polarity type different from the second polarity type HV well region.

12. The memory cell of claim 1 comprising a native layer disposed in the substrate between the first and second wells.

13. The memory cell of claim 1 wherein the second isolation well comprises a high voltage (HV) well region, the first well serves as a capacitor well and the second well serves as a transistor well.

14. The memory cell of claim 13 wherein the HV well region is a common HV well encompassing memory cells of a memory array.

15. The memory cell of claim 14 wherein the first well comprises a first polarity type and the HV well region is of a second polarity type different from the first polarity type.

16. The memory cell of claim 14 wherein the memory array comprises an AND-type configuration.

17. The memory cell of claim 14 wherein the memory array comprises a NOR-type configuration.

18. The memory cell of claim 13 comprising a native layer between the first and second wells.

19. The memory cell of claim 13 wherein:
the first isolation well comprises a first polarity type; and
the HV well region comprises a second polarity type.

20. The memory cell of claim 18 wherein the substrate comprises at least a cell isolation region having a shallow isolation trench (STI) region which separates the first and second wells, wherein the native layer underlaps the cell isolation region and is an intrinsically doped layer.

* * * * *